United States Patent [19]

Kirby

[11] 4,231,629

[45] Nov. 4, 1980

[54] APPARATUS FOR CONNECTION OF COAXIAL CABLES TO A PRINTED CIRCUIT MOTHER BOARD

[75] Inventor: Robert E. Kirby, Garner, N.C.

[73] Assignee: Telex Computer Products, Inc., Raleigh, N.C.

[21] Appl. No.: 4,460

[22] Filed: Jan. 18, 1979

[51] Int. Cl.³ .................. H01R 17/18; H05R 1/12
[52] U.S. Cl. ...................... 339/17 M; 339/17 C; 339/177 E
[58] Field of Search ........ 339/177 R, 177 E, 176 MP, 339/17 C, 17 R; 361/411, 412, 413, 415

[56] References Cited

U.S. PATENT DOCUMENTS

| | | | |
|---|---|---|---|
| 3,147,402 | 9/1964 | Hochstetler | 361/412 X |
| 3,271,626 | 9/1966 | Howrilka | 361/415 |
| 3,594,687 | 7/1971 | Alderfer | 339/177 R X |
| 3,829,741 | 8/1974 | Athey | 361/412 X |

Primary Examiner—Howard N. Goldberg
Assistant Examiner—Eugene F. Desmond
Attorney, Agent, or Firm—Head & Johnson

[57] ABSTRACT

Apparatus by means of which a plurality of coaxial cables can be connected through a flexible adapter board to a printed circuit mother board, comprising, a rigid metal chassis and means to support a flexible adapter board, by means of screws attaching it to the chassis. On one end of the adapter is a metal bracket having a flat portion parallel to and spaced from the adapter board, to which are fastened a plurality of coaxial cable terminals. The central conductors of each terminal extends as pins to and through selected holes in the adapter, and are soldered to the metal conductors on the surface of the PCB adapter. At the second end of the adapter is a male terminal, which is adapted, to be inserted into and connect with a printed circuit board receptacle, positioned on the mother board, which is conventionally fastened removably to the chassis. The adapter is constructed with a plurality of metal conductors on its surface, each one connecting from one of the coaxial cable terminal pins, to a contact on the male connector. The bracket is rigidly attached to the first end of the adapter and to the chassis, so that the coaxial cables can be conveniently attached and detached from the adapter without affecting the mother board in any way; while isolating the mother board from any vibration of the coaxial connectors.

3 Claims, 2 Drawing Figures

APPARATUS FOR CONNECTION OF COAXIAL CABLES TO A PRINTED CIRCUIT MOTHER BOARD

BACKGROUND OF THE INVENTION

1. Field of the Invention

This invention lies in the field of printed circuit logic boards and coaxial cables connected thereto.

More particularly, it concerns an apparatus by means of which a plurality of coaxial cables can be conveniently attached to, and removed from, terminals which are rigidly attached to a chassis in a manner by which the terminal pins of the terminals are attached to conductors which are connected through a suitable terminal to a mother board.

2. Description of the Prior Art

In the design of logic apparatus of all kinds, including computer terminal controllers and similar devices, it is often necessary to use flexible coaxial cables to connect from a first mother board on a first chassis to another board on another chassis, and so on. In the past this has been done by physically soldering the coaxial cable to terminals on a printed circuit board (PCB).

This type of assembly was very inefficient and unsatisfactory for several reasons. The first is that because of the need to physically solder wires on the PCB, it required a trained technician, or service man, to make the connection. Secondly, because of the substantial weight of the coaxial cable, there was a tendency for wires to break at the connection, or on the PCB in the event of substantial vibration of the apparatus, such as when mounted in a vehicle, for example.

Both of these difficulties and disadvantages have been overcome by the apparatus of the present invention.

SUMMARY OF THE INVENTION

It is a primary object of this invention to provide an apparatus for electrical connection of coaxial cables to a printed circuit mother board, without having any electrical or mechanical effect on the operation of the mother board.

These and other objects are realized and the limitations of the prior art are overcome in this invention, by mounting the mother board in a selected position on a metal chassis, and providing a PCB adapter which is attached rigidly to the chassis in a selected position, such that a connector on one end of the PCB adapter has a PCB connector which is adapted to be inserted into a PCB receptacle mounted on the mother board.

A metal bracket is provided and is mounted rigidly, with the PCB adapter, to the chassis. Thus, any flexibility in the bracket is communicated to the chassis and not to the PCB adapter or to the mother board. The metal bracket has a plurality of openings through which coaxial cable terminals can be inserted and locked, as by means of threaded nuts. The electrical connection from the terminal extends as a pin, which is passed through prepared openings in the PCB adapter, and soldered to electrical conducting strips or conductors on the surface of the PCB adapter. These conductors connect from the pins to corresponding strips on a connector on the PCB adapter.

Thus, when a coaxial cable is inserted into one of these terminals, its central conductor connects to the pin of the terminal, and thus to the conducting strip or conductor on the surface of the PCB adapter, to the corresponding connector strip and to the receptacle on the mother board, and to a point in the circuit of the mother board.

The important features of this invention are that the coaxial cables are readily removably attached to terminals on a bracket which is rigidly mounted to the PCB adapter and to the chassis. Thus, the bracket can be held rigidly, in such a manner that it does not transmit vibrations, which may occur on the coaxial cable to the wiring on the printed circuit board adapter or to the mother board and other PCBs attached thereto. The pins of the coaxial cable terminals are then connected through a PCB adapter, through a PCB connector, into a PCB receptacle mounted on the mother board. The natural flexibility of the printed circuit adapter strip isolates the mother board from any vibration of the coaxial cables.

The bracket which receives the coaxial cable terminals is mounted on the chassis in such a position that it is readily available to an operator, to place on and remove from the bracket any or all of the coaxial cables. Since minimum skill is required for inserting and removing coaxial cables from their terminals, such connections can be made by people with little, if any training, and do not require a skilled technician.

While coaxial cables have been attached to a printed circuit board by means of brackets attached to the printed circuit board, such boards were subject to vibration due to vibration of the coaxial cables, because neither the bracket nor the board were rigidly attached to a chassis. In this invention the use of a PCB adapter does two things. It provides a rigid mounting for the bracket, and further isolates the mother board from any vibration which may be induced by the coaxial cable.

BRIEF DESCRIPTION OF THE DRAWINGS

These and other objects and advantages of this invention and a better understanding of the principles and details of the invention, will be evident from the following description taken in conjunction with the appended drawings, in which.

DESCRIPTION OF THE PREFERRED EMBODIMENT

Figures 1, 2:
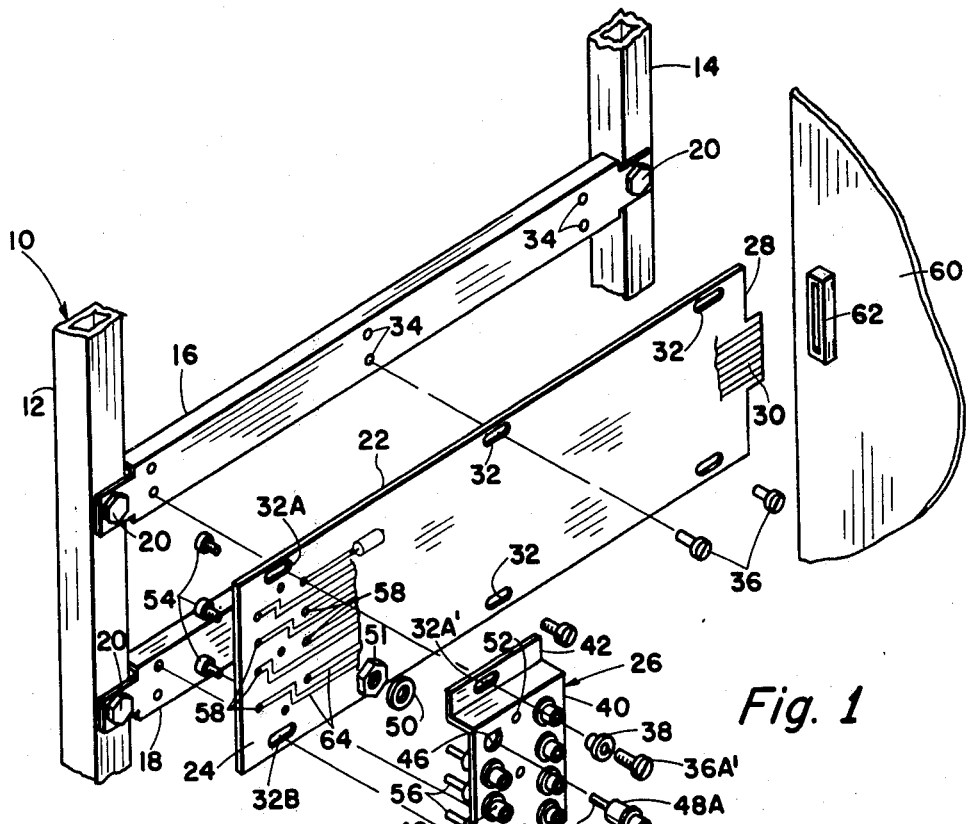
FIG. 1 is an exploded view of the entire apparatus.
FIG. 2 is a detailed view in cross-section of the bracket and its mounting to the chassis.

Referring now to the drawings, there is shown a portion of a rigid metal chassis indicated generally by the numeral 10. This has at least two bars 16 and 18 which are attached to posts 12 and 14 respectively, by screws 20. There are a plurality of tapped holes 34 positioned in a selected manner on the bars 16 and 18.

A PCB adapter 22 is provided with a plurality of openings 32 which are adapted to fit over the tapped screw holes 34 on the two bars 16 and 18. At one end of the PCB adapter 22 is a PCB connector 30. At a selected point on the PCB adapter 22 is mounted in detachable manner, a bracket indicated generally by the numeral 26. This is a metal bracket of selected form, preferably having a flat portion 40 with two leg portions 42 and 44, which are provided with appropriate openings 32' and 32B' (not shown) which will fit conveniently over the openings 32A and 32B of the PCB adapter 22. The screws 36A' and 36B' with insulated washers 38 can be used to attach the bracket 26 and the PCB adapter 22 to the bars 16 and 18.

There are a plurality of openings 46 into which are inserted coaxial cable receptacles 48. Each of the receptacles, such as 48A, is locked in position through the openings 46 by means of a washer 50 and a nut 51, or by any other convenient method of attachment of the coaxial cable receptacle to a bracket.

An axial pin 56 extends from the receptacle 48A, for example, which with the pins of the other receptacles are adapted to fit into appropriate openings 58 which are drilled in the PCB adapter 22. The pins 56 can be soldered to metal strips 64 which are attached to the PCB adapter 22 and can be soldered thereto. Not shown, but well known in the art, these strips or conductors 64 run from the pins 56 along the PCB adapter to appropriate elements of the connector 30, and connect into corresponding elements in the PCB receptacle 62, which is mounted in the mother board 60.

Thus, when a coaxial cable (not shown) is inserted into the receptacle 48, its central conductor will connect to the pin 56 and to an appropriate strip or conductor 64 on the PCB adapter, to the appropriate element of the connector 30 and to the appropriate element in the receptacle 62 and to the circuitry on the mother board 60.

At the same time, the outer conductor of the coaxial cable will make connection with the outer portion of receptacle of 48A which is connected to the metal bracket 26. The two legs 42 and 44 of the metal bracket 26 will conduct to an appropriate strip or conductor on the PCB adapter, to the appropriate element of the connector 30 and to the appropriate element in the receptacle 62 and to the circuitry on the mother board 60.

By reference to FIG. 2, it is shown in detail how the bracket 26 is attached to the PCB adapter 22 by means of screws 54 into threaded openings 52 and also by the screws 36A', 36B', with corresponding insulated washers 38. The screws 36A' and 36B' also pass through the openings 32A and 32B of the PCB adapter 22 and into the threaded openings 34 of the bars 16 and 18. Thus, a very rigid assembly is provided whereby the bracket is locked directly with the PCB adapter, to the rigid frame of the chassis. With this kind of rigid attachment of the coaxial cable receptacles, there is no opportunity for vibration to be induced by oscillation of the coaxial cables, which might cause vibration of the printed circuits on the PCB adapter and/or the mother board 60, and any other printed circuit boards that might be attached thereto.

While the invention has been described with a certain degree of particularity, it is manifest that many changes may be made in the details of construction and the arrangement of components without departing from the spirit and scope of this disclosure. It is understood that the invention is not limited to the embodiments set forth herein for purposes of exemplification, but is to be limited only by the scope of the attached claim or claims, including the full range of equivalency to which each element thereof is entitled.

What is claimed is:

1. Apparatus for connection of a coaxial cable to a printed circuit mother board, comprising:
   (a) a rigid metal chassis;
   (b) a flexible adapter board rigidly removably fastened to and supported by said chassis at a first end, and adapted to be removably plugged into said mother board at its second end;
   (c) a metal bracket, and means to attach said metal bracket to said adapter at said first end of said adapter; at least one opening through said bracket and including at least one conventional coaxial cable terminal, locked to said bracket by screw means; pin connector means extending from said coaxial cable terminal on said bracket, and adapted to pass through a prepared opening in, and to be soldered to, a metal conductor on the surface of said adapter;
   (d) multiple screw means passing through said bracket and said adapter into said chassis to lock said bracket and said adapter thereto;
   (e) male connector means on said second end of said adapter, and conductor means on said adapter connecting said pin of said at least one coaxial cable terminal to said male connector means;
   (f) main logic mother board removably attached to said chassis and having at least one connector socket adapter to receive said male connector on said adapter;
   whereby a coaxial cable plugged into said coaxial cable terminal on said bracket can be connected to a circuit on said mother board without carrying vibrations to said mother board.

2. The apparatus as in claim 1 including a plurality of openings in said bracket and a plurality of coaxial cable terminals attached thereto, with their pins passing through selected openings in said adapter, and attached by said conductor means to said male connector means, and to said connector socket on said mother board.

3. The apparatus as in claim 1 in which said bracket is in the form of a hat-section in which said openings are in the flat top of said bracket and said coaxial cables are perpendicular to said adapter.

* * * * *